United States Patent
Meng

(10) Patent No.: US 10,348,080 B1
(45) Date of Patent: Jul. 9, 2019

(54) SYSTEM AND METHOD FOR MONITORING FUSES IN A VEHICLE

(71) Applicant: TOYOTA MOTOR ENGINEERING & MANUFACTURING NORTH AMERICA, INC., Erlanger, KY (US)

(72) Inventor: Ming Michael Meng, Novi, MI (US)

(73) Assignee: TOYOTA MOTOR ENGINEERING & MANUFACTURING NORTH AMERICA, INC., Erlanger, KY (US)

( * ) Notice: Subject to any disclaimer, the term of this patent is extended or adjusted under 35 U.S.C. 154(b) by 0 days.

(21) Appl. No.: 15/866,820

(22) Filed: Jan. 10, 2018

(51) Int. Cl.
*H02H 3/04* (2006.01)
*H01H 85/30* (2006.01)
*G01R 31/07* (2006.01)
*B60Q 11/00* (2006.01)

(52) U.S. Cl.
CPC ........... *H02H 3/046* (2013.01); *B60Q 11/002* (2013.01); *G01R 31/07* (2013.01); *H01H 85/30* (2013.01)

(58) Field of Classification Search
CPC ...... H02H 3/046; B60Q 11/002; G01R 31/07; H01H 85/30
See application file for complete search history.

(56) References Cited

U.S. PATENT DOCUMENTS

| | | | | |
|---|---|---|---|---|
| 6,771,079 B2* | 8/2004 | Lin | ........................ | H01H 85/30 307/10.1 |
| 2002/0161501 A1* | 10/2002 | Dulin | .................... | B06B 1/0215 701/45 |
| 2004/0095258 A1* | 5/2004 | Bosch | ..................... | G08G 1/017 340/937 |
| 2004/0174141 A1* | 9/2004 | Luz | ......................... | G01R 31/36 320/132 |
| 2011/0140902 A1* | 6/2011 | Huss | ...................... | H01H 85/32 340/638 |
| 2014/0167951 A1* | 6/2014 | Schnorr | .................. | B60Q 1/00 340/458 |
| 2014/0168827 A1* | 6/2014 | Mirzaei | .................. | H02H 3/253 361/31 |
| 2015/0029031 A1* | 1/2015 | Pank | .................... | B60K 28/066 340/576 |
| 2016/0299186 A1* | 10/2016 | Fan | ......................... | G01R 31/07 |
| 2018/0144640 A1* | 5/2018 | Price | .................... | G01G 19/086 |
| 2018/0229675 A1* | 8/2018 | Abdalla | ................. | H01R 12/57 |

FOREIGN PATENT DOCUMENTS

| | | |
|---|---|---|
| CN | 202528929 U | 11/2012 |
| FR | 2 730 814 A1 | 8/1996 |
| KR | 2002-0055659 A | 7/2002 |

* cited by examiner

*Primary Examiner* — Leon Flores
(74) *Attorney, Agent, or Firm* — Oblon, McClelland, Maier & Neustadt, L.L.P.

(57) ABSTRACT

A method and system for monitoring fuses in a vehicle are provided. The method includes receiving data from a fuse monitor coupled to one or more fuses. Each fuse associated with one or more electronic devices of the vehicle. The method also includes analyzing the data to determine whether a faulty fuse is detected and outputting an alert to a display of the vehicle in response to detecting a faulty fuse. The alert includes at least one of a fuse location, a fuse type, or fuse replacement information and activates a fuse application of the display of the vehicle to cause the alert to output on the display.

20 Claims, 7 Drawing Sheets

SYSTEM AND METHOD FOR MONITORING FUSES IN A VEHICLE

BACKGROUND

Fuses are used to avoid damage by surge to internal circuit due to short or overload of an electric appliance. However, identification of the location of the burnt fuse relies on the manual inspection of all fuses one by one. U.S. Pat. No. 6,771,079 B2 entitled "Automobile Multi-Purpose DC Source Protection Monitor" by Lin describes a method and a device that includes source status light emitting diodes that indicates location of burn out fuses.

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention.

SUMMARY

The present disclosure relates to a method for monitoring fuses in a vehicle. The method includes receiving data from a fuse monitor coupled to one or more fuses. Each fuse associated with one or more electronic devices of the vehicle. The method also includes analyzing the data to determine whether a faulty fuse is detected and outputting an alert to a display of the vehicle in response to detecting a faulty fuse. The alert includes at least one of a fuse location, a fuse type, or fuse replacement information, and activates a fuse application of the display of the vehicle to cause the alert to output on the display.

The present disclosure also relates to a system for monitoring fuses in a vehicle. The system includes a display, one or more fuses coupled to one or more electronic devices, a fuse monitor coupled to one or more fuses; and a processor. The processor is configured to receive data from the fuse monitor, analyze the data to determine whether a faulty fuse is detected, output an alert to the display of the vehicle in response to detecting a faulty fuse, and wherein the alert activates a fuse application of the display of the vehicle to cause the alert to output on the display.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
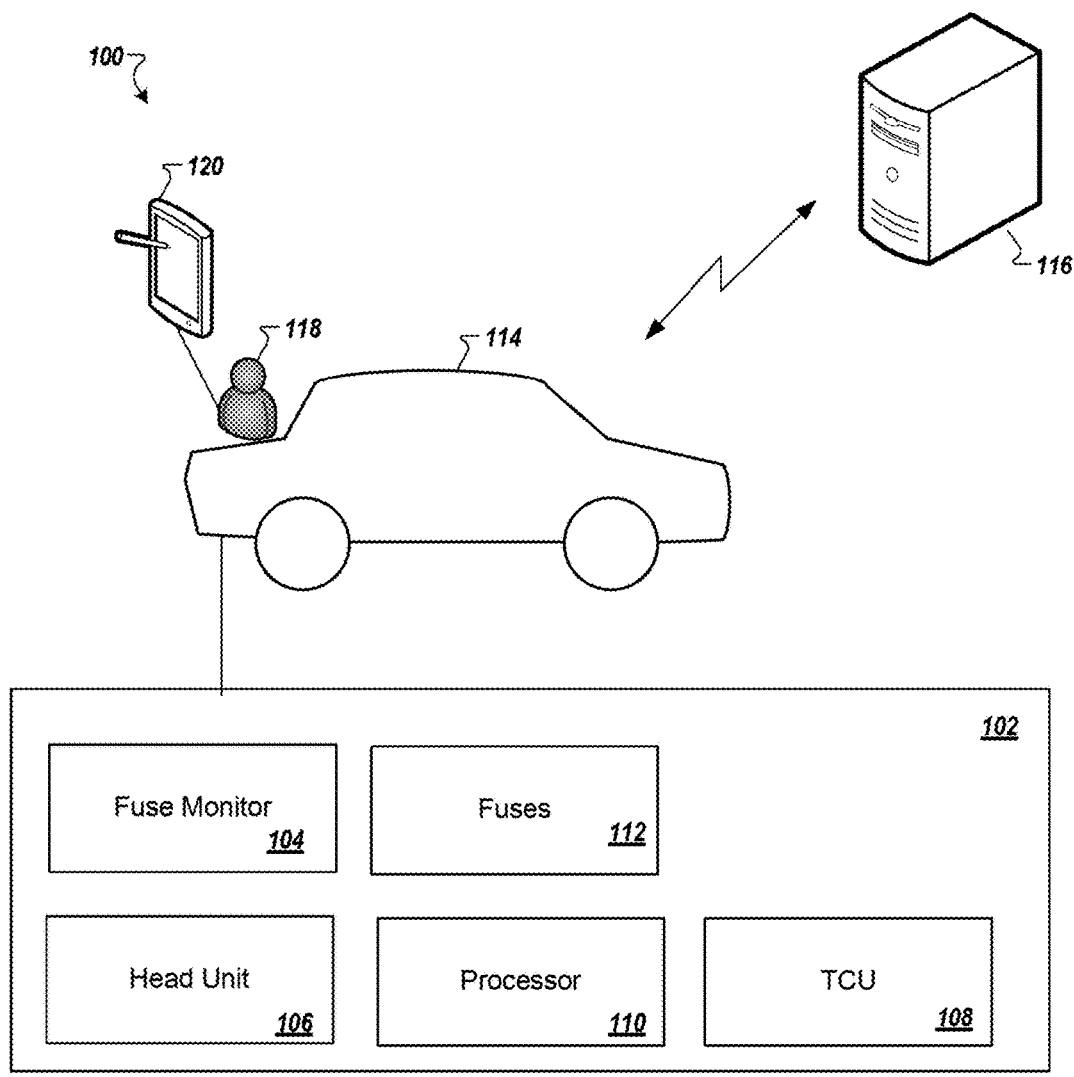
FIG. 1 is a schematic of a system environment for monitoring and displaying fuse status information according to one example.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). Reference throughout this document to "one embodiment", "certain embodiments", "an embodiment", "an implementation", "an example" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

Referring now to the drawings, wherein like reference numerals designate identical or corresponding parts throughout several views, the following description relates to a system and associated methodology for automatically monitoring fuses and displaying information associated with burned out fuses.

A relay box (or fuse box) includes multiple fuses associated with electronic devices in a vehicle. The relay box may be located in the instrument panel of the vehicle. Conventionally, an individual or a mechanic may use a small chart to match the fuses in the relay box with the electronic devices of the vehicle. Sometimes this may be confusing and may include testing of all fuses one by one until the mechanic finds the blown fuse.

FIG. 1 is a schematic of a system environment 100 for monitoring fuses in a vehicle 114 and displaying information associated with the fuses according to one example. The system 102 may include a fuse monitor 104, a head unit 106, a telematics control unit (TCU) 108, a processor 110, and fuses 112. The fuse monitor 104 is configured to monitor fuses 112 and output fuse information to the head unit 106. The head unit 106 may display fuse information and store fuse information in a memory of the head unit 106. The head unit 106 may provide audio (e.g., audible alerts via a speaker) and video services to a vehicle user 118. The head unit 106 may also provide navigation services, entertainment such as music, heating, ventilating, and air-conditioning information The head unit 106 may receive inputs from the vehicle user 118 via one or more user interfaces (e.g., console display, dash display). The user interface may include buttons, a multiple touch input device, a microphone, and speakers. The microphone may be configured to receive user voice commands. The vehicle user 118 may retrieve the status of one or more fuses 112 of the vehicle 114 using the user interfaces of the head unit 106.

The vehicle 114 may also include an instrument panel. The instrument panel may also include a display. In one example, the instrument panel may additionally or alternatively display the fuse information.

The TCU 108 may be a data communication module (DCM) that provides communications over a network to any server that may be included with multiple services available to the vehicle user 118. For example, the TCU 108 may connect to a repair center available to the vehicle user 118. The TCU 108 may upload the fuse information to the repair center in response to the vehicle user request. The TCU 108 may automatically upload the fuse information to a server 116. The vehicle user 118 or a mechanic at the repair center may retrieve the stored fuse information from the server 116 using an electronic device 120 (e.g., laptop, smartphone, desktop computer). The network may be a cellular network.

The cellular network may include a plurality of base stations that are configured to receive and transmit data over wired systems such as public switched telephone network (PSTN) and backhaul networks. The cellular network can include wide area networks, metropolitan area networks, the Internet, satellite networks, or the like. Thus, the base stations include one or more antennas, transceivers, and processors that execute machine readable instructions to exchange data over various wired and/or wireless networks.

The fuse information may include a fuse type, a fuse location, a fuse current rating, an electronic device associated with the fuse, and the like. In addition, the stored information may include a timestamp that includes the date and time that indicates when a fault is detected.

The modules and units described herein may be implemented as either software and/or hardware modules and may be stored in any type of computer-readable medium or other computer storage device. For example, each of the modules described herein may be implemented in circuitry that is programmable (e.g., microprocessor-based circuits) or dedicated circuits such as application specific integrated circuits (ASICS) or field programmable gate arrays (FPGAS). In one embodiment, a central processing unit (CPU) could execute software to perform the functions attributable to each of the modules described herein. The CPU may execute software instructions written in a programming language such as Java, C, or assembly. One or more software instructions in the modules may be embedded in firmware, such as an erasable programmable read-only memory (EPROM).

Figure 2:
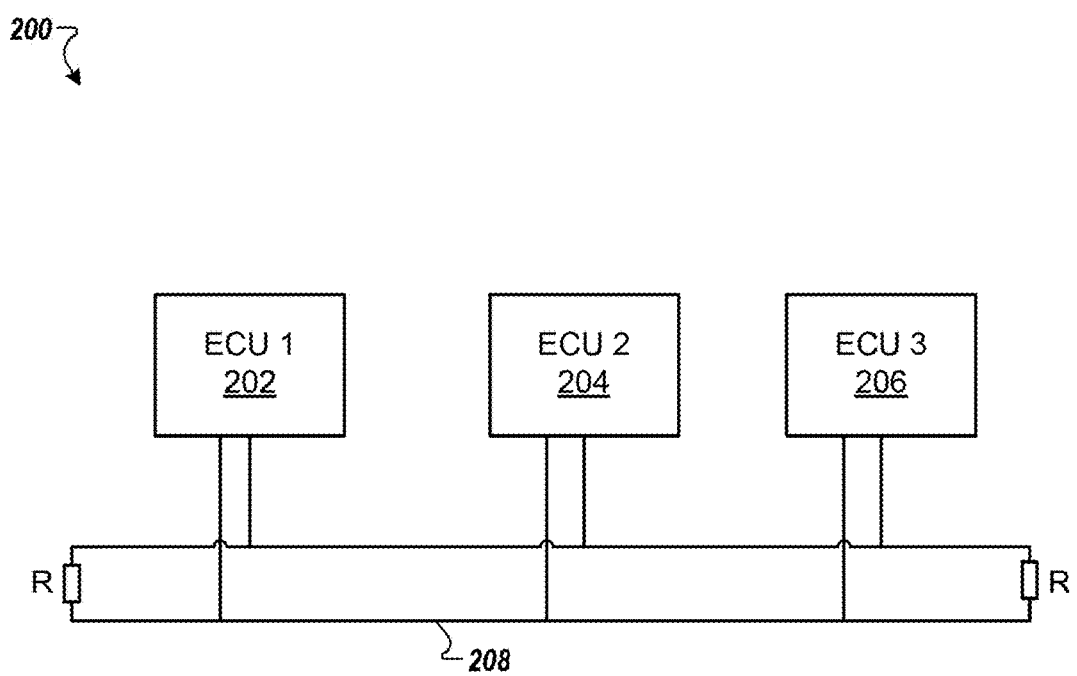
FIG. 2 is a schematic of connected electrical control units in a vehicle according to one example.

FIG. 2 is a schematic of connected electrical control units (ECUs) in the vehicle 114 according to one example. Multiple ECUs 202, 204, 206 may be connected to each other via a bus 208. Exemplary communication buses in the vehicle 114 are described in FIG. 7. For example, a first ECU 202 may be associated with the head unit 106 and a second ECU 204 may be a door control. The first ECU 202 and the second ECU 204 may communicate via the bus 208.

Figure 3A:
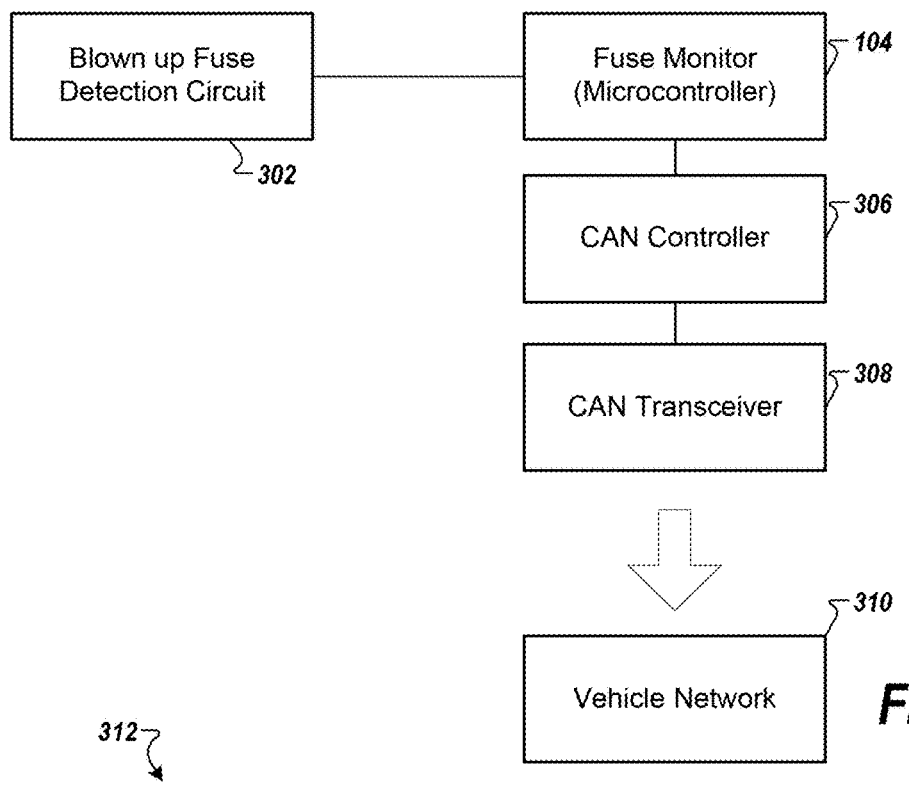
FIG. 3A is a schematic that shows data flow in the system according to one example.

FIG. 3A is a schematic that shows data flow in the system according to one example. The fuse monitor 104 receives data or signal from blown fuse detection circuitry 302. The fuse monitor 104 outputs the data to the vehicle network 310 via a controller area network (CAN) controller 306 and a CAN transceiver 308. The fuse monitor 104 may receive signals from multiple fuse detection circuitry 302. For example, multiple blown fuse detection circuitry may be connected in parallel to the fuse monitor 104.

Figure 3B:
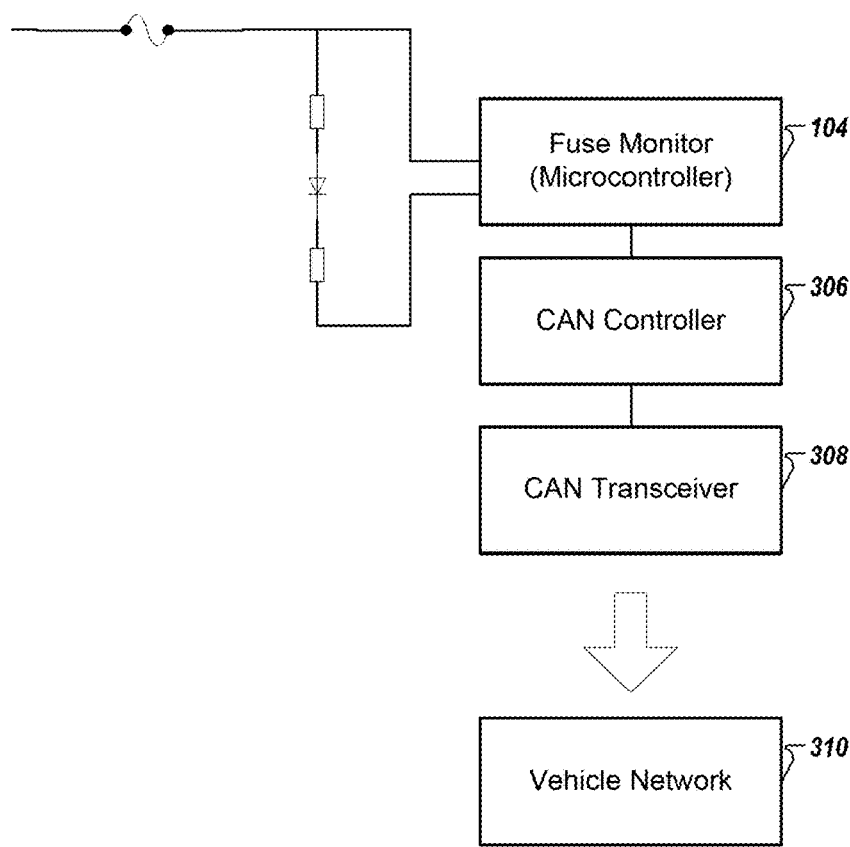
FIG. 3B is a schematic that shows data flow in the system according to one example.

An exemplary implementation of a blown up fuse detection circuitry 312 is shown in FIG. 3B. The blown fuse detection circuitry may include two resistors and a light emitting diode or a diode. Other blown up/faulty fuse detection circuitry may be used as would be recognized by one of ordinary skill in the art.

Figure 4:
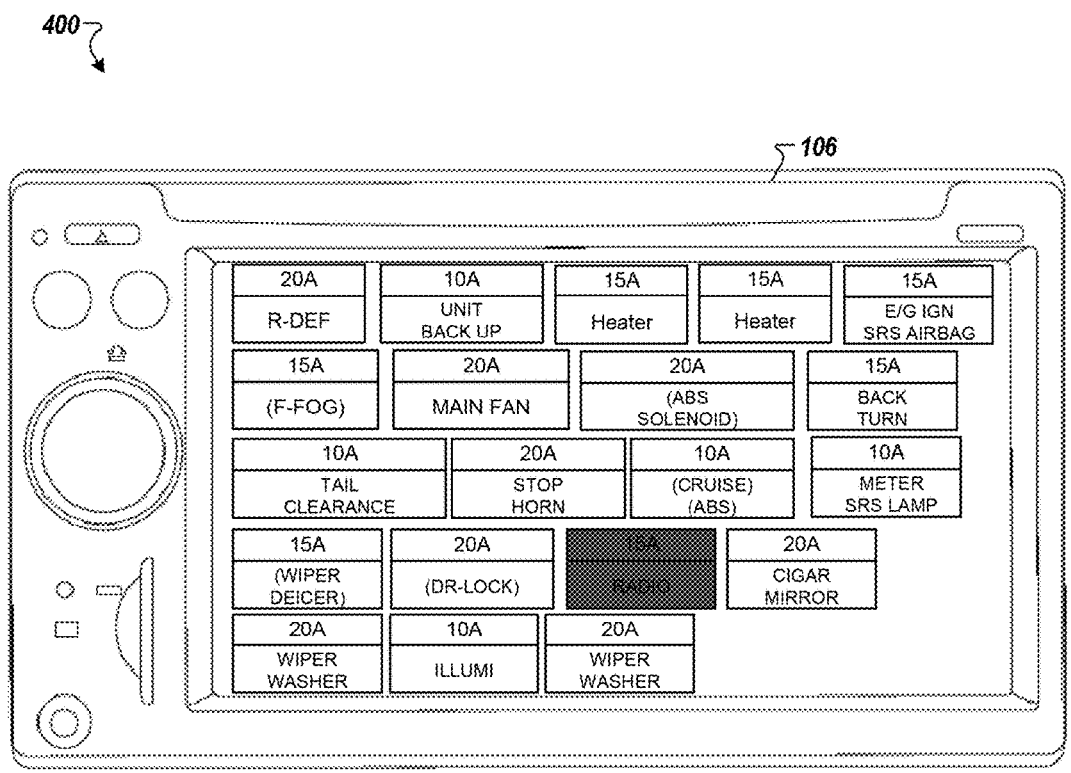
FIG. 4 is a schematic that shows a display of a vehicle according to one example.

FIG. 4 is a schematic 400 that shows the head unit 106 according to one example. The head unit 106 may display the fuse information. The head unit 106 may change one or more display properties of the information associated with a blown-up fuse. For example, the information may be highlighted with a color different than the color used to display non-faulty fuses (e.g., faulty fuse information may be displayed in a red color while the information associated with non-faulty fuses are displayed in green). The processor 110 may also alter the brightness and color of the information associated over a period of time. In one implementation, the faulty fuse information may be displayed flashing. In one implementation, only fuse information associated with faulty fuse may be displayed. The fuse information (i.e., schematic 400) may be accessed from a main menu of the head unit 106. Then, the vehicle user or the mechanic may easily replace the faulty fuse.

In one implementation, the fuse monitor 104 may send a signal to the head unit 106 indicating that a faulty fuse is detected. The signal causes the head unit 106 to display a notification to the user indicating that the faulty is detected. The notification also includes the information associated with the faulty fuse. The notification may include the name and function of the electronic device associated with the faulty fuse. For example, the notification may be "The radio unit is not functioning properly due to a blown fuse."

Figure 5:
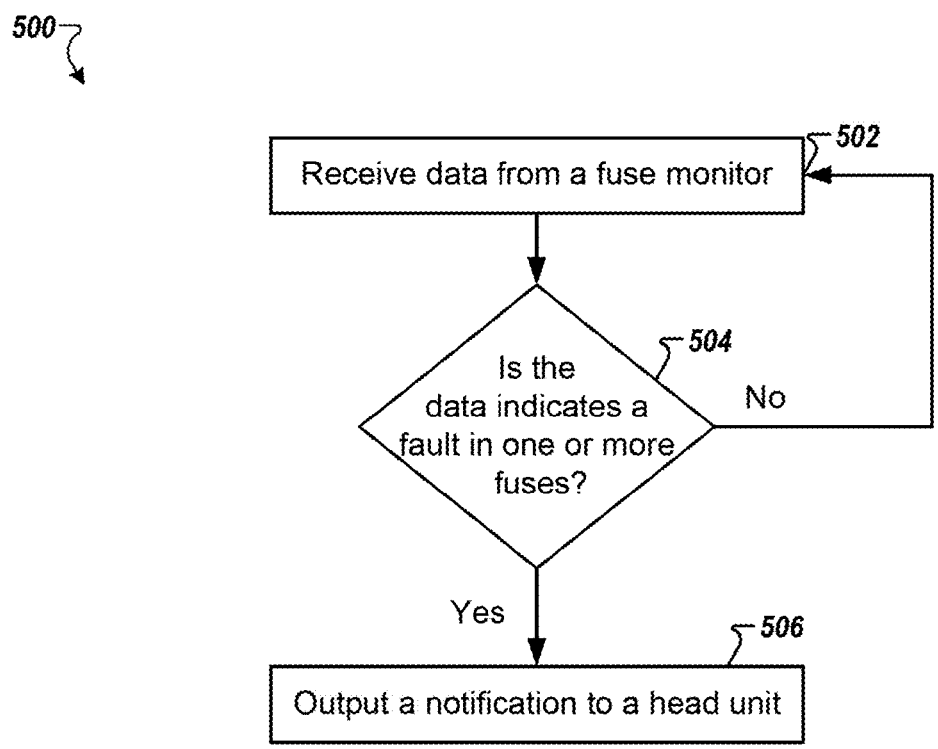
FIG. 5 is a flowchart of a method for acquiring fuse information and outputting a notification when a faulty fuse is detected according to one example.

FIG. 5 is a flowchart of a method 500 for monitoring and displaying fuse information according to one example. The method 500 may be implemented by the system 102.

At step 502, the processor 110 may continuously receive data from the fuse monitor 104. The processor 110 may also poll the fuse monitor 104 at predetermined periods (e.g., every 5 minutes, every 10 minutes) or according to a polling schedule (e.g., when a vehicle engine is ignited).

At step 504, the processor 110 analyzes the data received at step 502 to determine whether the data indicates a fault in one or more fuses 112. In response to determining that a fault in at least one fuse is detected, the process proceeds to step 506.

At step 506, a notification is output to the head unit 106. As described previously herein, the information associated with the faulty fuse may be output on the display. The notification may also include an audible alert. In one implementation, the audible alert is only output when the faulty fuse is associated with an electric device that may affect safety of the vehicle user. For example, when the electric device is a headlamp and the current time is nighttime, the audible alert is output. The processor 110 may use a look-up table stored in the memory of the head unit 106 to check whether the electric device is included. Further, the processor 110 may retrieve any condition/criteria that is to be satisfied before the audible alert is output. For example, for vehicle lights the condition may be night time or after dawn. In another example, for an air conditioning unit, the condition may be outside temperature below a lower predetermined temperature threshold or above an upper predetermined temperature threshold. Once the processor 110 retrieves the condition/criteria from the look-up table, the processor 110 may poll an electronic device associated with the criteria. For example, the processor 110 may poll an outside temperature sensor to determine a current temperature. Then, the processor 110 may compare the current temperature with the lower predetermined temperature threshold and the upper predetermined temperature threshold. In response to determining that the current temperature exceeds the upper predetermined temperature threshold or the current temperature is below the lower predetermined temperature threshold, the processor 110 output the audible alert and the notification that a faulty fuse associated with the air conditioning system is detected.

The notification may cause other applications/functions running by the head unit 106 to be temporary deactivated. For example, the head unit 106 may deactivate or halt music playing.

The processor 110 may upload to the server 116 via the TCU 108 information associated with the faulty fuse including a timestamp that indicates when the faulty fuse is detected.

In one implementation, the processor 110 may send an alert via the TCU 108 to an electronic device associated with the vehicle user. The alert causes the electronic device associated with the vehicle user to activate an application associated with the vehicle and to display a notification that one or more fuses 112 are faulty and needs replacement. The notification may also include the electric device associated with the fuse.

A system which includes the features in the foregoing description provides numerous advantages to users. In particular, the system provides a method for automatically notifying a vehicle user about faulty fuses which increase road safety (e.g., when the fuse is associated with a headlamp). In addition, detecting faulty fuses and causing the faulty fuse information to display on the head unit 106 and to be automatically uploaded to the server provide time sensitive useful information to the vehicle user.

Figure 6:
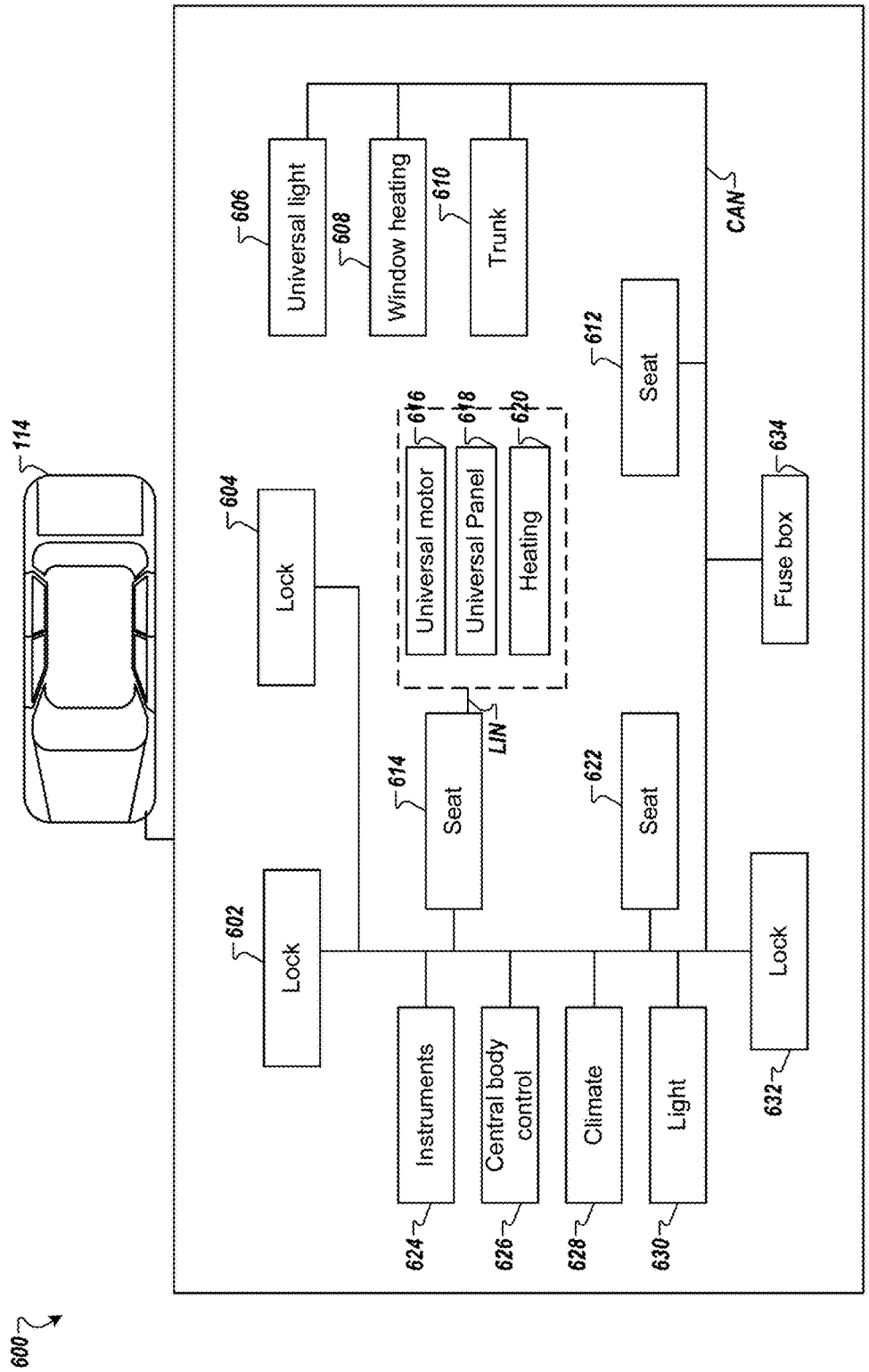
FIG. 6 is a block diagram of vehicle devices connected through a vehicle network according to one example.

FIG. 6 is a simplified block diagram 600 of vehicle devices connected through a vehicle network according to one example. Electronic devices such as locks 602, 604, 632, instruments 624, central body control 626, climate 628, light 630, seats 614, 622, 612, universal light 606, window heating 608, and trunk 610 may be connected via a CAN bus. In addition, a fuse box 634 may be connected to the CAN bus. The fuse monitor 104 is also connected to the CAN bus. The fuse box 634 may include the blown up fuse detection circuitry 302. Further, each electronic device may be connected via a local interconnect network (LIN) to multiple associated devices. For example, the seat 614 may be connected via the LIN to a universal motor 616, a universal panel 618, and a heating system 620.

Figure 7:
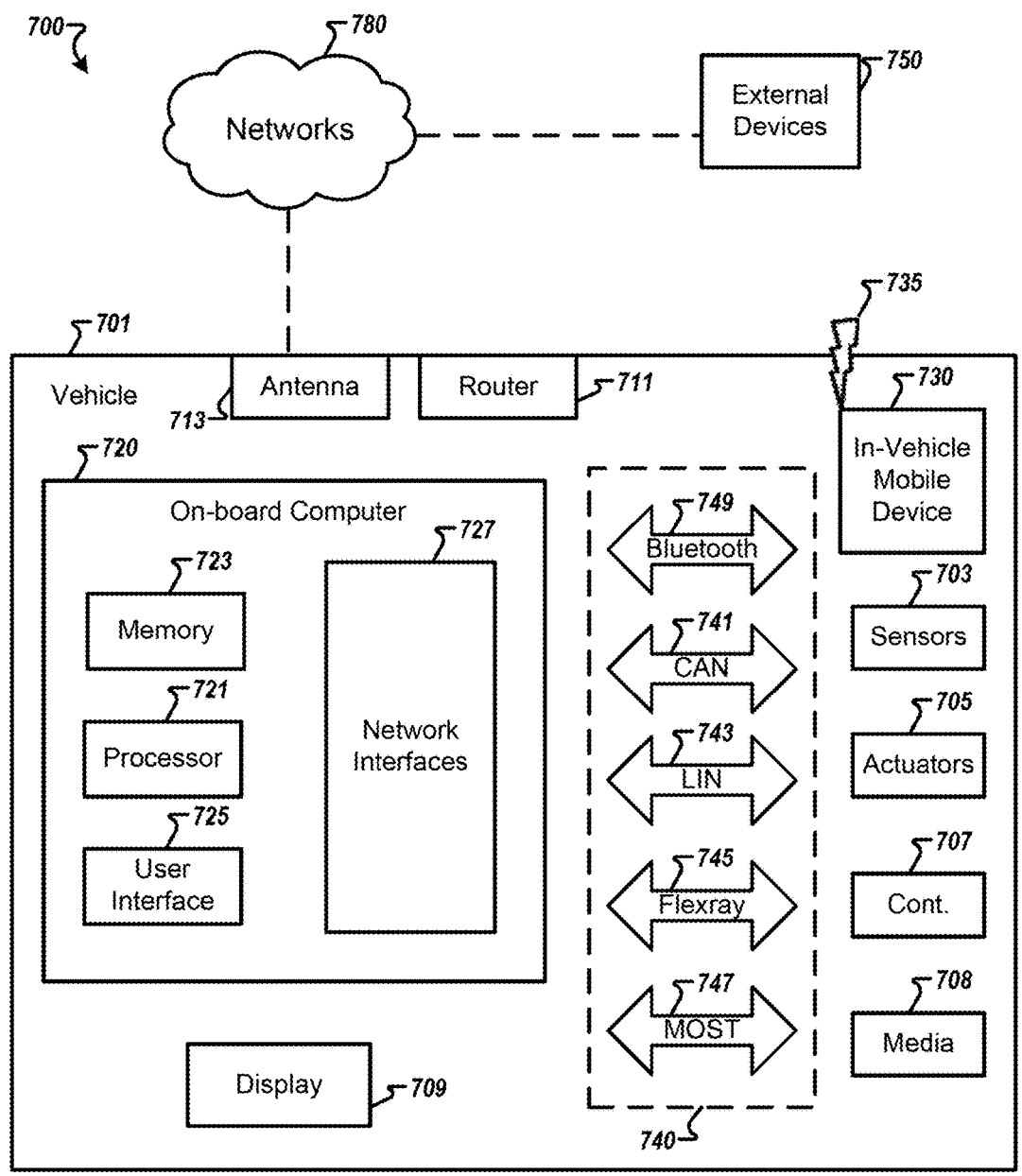
FIG. 7 is a block diagram of a vehicle environment according to one example.

FIG. 7 is a simplified block diagram of a vehicle environment 700 in which embodiments of the invention disclosed herein may be implemented. The vehicle environment 700 includes a vehicle 701 in communication with one or more external devices 750 by way of one or more external networks 780. Vehicle 701 also includes various internal networks 740 for interconnecting several vehicle devices within the vehicle as will be discussed below. The vehicle environment 700 may also include one or more in-vehicle mobile device 730. External devices 750 include any device located outside the vehicle 701 such that the external device must communicate with the vehicle and its devices by an external network 780. For example, the external devices may include mobile devices, electronic devices in networked systems (e.g., servers or clients in a local area network (LAN), etc.), on board computers of other vehicles etc. In-vehicle mobile devices 730 are devices which are located within, or in the vicinity of the vehicle 701 such that the in-vehicle mobile device can communicate directly with internal networks 740 of the vehicle 701. In-vehicle mobile devices 730 may also connect with external networks 780.

Vehicle 701 includes vehicle devices integral with or otherwise associated with the vehicle 701. In the embodiment of FIG. 7, vehicle devices include one or more sensors 703, one or more actuators 705, one or more control units 707, one or more media systems 708, one or more displays 709, one or more routers 711, one or more antenna 713, and one or more on board computers 720. As used herein, the term "vehicle device" is meant to encompass sensors, actuators, controllers, electronic control units (ECUs), detectors, instruments, embedded devices, media devices including speakers, a CD and/or DVD player, a radio, vehicle navigation systems (e.g., GPS) displays, other peripheral or auxiliary devices or components associated with the vehicle 701.

Sensors 703 detect various conditions within (or in the immediate vicinity of) the vehicle 701. For example, sensors 703 may be temperature sensors, photosensors, position sensors, speed sensors, angle sensors or any other sensor for detecting a diagnostic condition or other parameter of the vehicle 701 or its ambient environment. Sensors 703 may be passive or "dumb" sensors that provide an analog representative of the sensed parameter, or so called "smart" sensors with integrated memory and digital processing capability to analyze the parameter sensed within the sensor itself. Actuators 705 cause motion of some mechanical element of the vehicle in response to a control signal. For example, actuators 705 may be hydraulic actuators, pneumatic actuators or electrical/electronic actuators such as a stepper motor.

On-board computer 720 is a vehicle device for providing general purpose computing functionality within the vehicle 701. The on-board computer 720 typically handles computationally intensive functions based on software applications or "apps" loaded into memory. On-board computer 720 may also provide a common interface for different communication networks in the vehicle environment 700. On-board computer 720 includes one or more processor 721, one or more memory 723, one or more user interface 725 (e.g., the operator interface described previously herein), and one or more network interface 727.

Multiple internal vehicle networks represented by 740 may exist in the vehicle 701 to provide communication pathways to various vehicle devices distributed throughout the vehicle 701. An internal vehicle network 740 is a collection of nodes, such as vehicle devices, integrated with or otherwise linked to the vehicle and interconnected by communication means. Vehicle networks 740 typically include hard wired bus type networks, each providing communication pathways to particular vehicle devices distributed throughout a vehicle. FIG. 7 shows four examples of such hard wired networks: Controller Area Network (CAN) 741, Local Internet Network (LIN) 743, Flexray bus 745, and Media Oriented System Transport (MOST) network 747.

Other hard wired internal networks such as Ethernet may be used to interconnect vehicle devices in the vehicle 701. Further, internal wireless networks 749, such as near field communications, Bluetooth, etc. may interconnect vehicle devices.

Users (driver or passenger) may initiate communication in vehicle environment 700 via some network, and such communication may be initiated through any suitable device such as, in-vehicle mobile device 730, display 709, user interface 725, or external devices 750.

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A method for monitoring fuses in a vehicle, the method comprising:
   receiving data from a fuse monitor coupled to one or more fuses, each fuse associated with one or more electronic devices of the vehicle;
   analyzing, using processing circuitry, the data to determine whether a faulty fuse is detected; and
   outputting an alert to a display of the vehicle in response to detecting a faulty fuse,
   wherein the alert includes at least one of a fuse location, a fuse type, or fuse replacement information, and
   wherein the alert activates a software fuse application of the display of the vehicle to cause the alert to output on the display.

2. The method of claim 1, wherein the processing circuitry polls the fuse monitor according to a polling schedule.

3. The method of claim 1, further comprising:
   outputting an audible alert in response to determining that the faulty fuse belongs to a predetermined set of fuses.

4. The method of claim 3, further comprising:
   retrieving one or more criteria associated with the faulty fuse;
   retrieving data from one or more sensors associated with the one or more criteria; and
   outputting the audible alert when the one or more criteria are satisfied based on the retrieved data.

5. The method of claim 1, further comprising:
   deactivating one or more functions of a head unit associated with the display when a faulty fuse is detected.

6. The method of claim 1, further comprising:
   altering one or more display characteristics of information associated with the faulty fuse.

7. The method of claim 6, wherein the altering one or more display characteristics includes flashing the information associated with the faulty fuse.

8. The method of claim 1, further comprising:
   uploading via communication circuitry information associated with the faulty fuse to a server.

9. The method of claim 8, wherein the information includes the fuse type, a timestamp indicating date and time of a failure of the fuse, and an electronic device associated with the faulty fuse.

10. A system for monitoring fuses in a vehicle, the system comprising:
    a display;
    one or more fuses coupled to one or more electronic devices;
    a fuse monitor coupled to one or more fuses; and
    a processor configured to
       receive data from the fuse monitor,
       analyze the data to determine whether a faulty fuse is detected, and
       output an alert to the display of the vehicle in response to detecting a faulty fuse,
    wherein the alert includes at least one of a fuse location, a fuse type, or fuse replacement information, and
    wherein the alert activates a software fuse application of the display of the vehicle to cause the alert to output on the display.

11. The system of claim 10, wherein the processor is configured to poll the fuse monitor according to a polling schedule.

12. The system of claim 10, wherein the processor is further configured to:
    output an alert to a speaker in response to determining that the faulty fuse belongs to a predetermined set of fuses.

13. The system of claim 12, wherein the processor is further configured to:
    retrieve one or more criteria associated with the faulty fuse;
    retrieve data from one or more sensors associated with the one or more criteria; and
    output the alert to the speaker when the one or more criteria are satisfied based on the retrieved data.

14. The system of claim 10, wherein the processor is further configured to:
    deactivate one or more functions of a head unit associated with the display when a faulty fuse is detected.

15. The system of claim 10, wherein the processor is further configured to:
    alter one or more display characteristics of information associated with the faulty fuse.

16. The system of claim 15, wherein the altered one or more display characteristics includes flashing the information associated with the faulty fuse on the display.

17. The system of claim 10, wherein the processor is further configured to:
    upload via communication circuitry information associated with the faulty fuse to a server.

18. The system of claim 17, wherein the information includes the fuse type, a timestamp indicating date and time of a failure of the fuse, and an electronic device associated with the faulty fuse.

19. A non-transitory computer readable medium storing computer-readable instructions therein which when executed by a computer cause the computer to perform a method for monitoring fuses in a vehicle, the method comprising:
    receiving data from a fuse monitor coupled to one or more fuses, each fuse associated with one or more electronic devices of the vehicle;
    analyzing the data to determine whether a faulty fuse is detected; and
    outputting an alert to a display of the vehicle in response to detecting a faulty fuse,
    wherein the alert includes at least one of a fuse location, a fuse type, or fuse replacement information, and
    wherein the alert activates a software fuse application of the display of the vehicle to cause the alert to output on the display.

20. The method of claim 19, further comprising:
    polling the fuse monitor according to a polling schedule.

* * * * *